United States Patent [19]

Fisher et al.

[11] 4,249,135

[45] Feb. 3, 1981

[54] AMPLIFIER WITH SWITCHED CAPACITORS

[76] Inventors: Charles B. Fisher, 2850 Hill Park Rd., Montreal, Quebec, Canada, H3H 1T1; Sidney T. Fisher, 53 Morrison Ave., Mt. Royal, Montreal, Quebec, Canada, H3R 1K3

[21] Appl. No.: 133,914

[22] Filed: Mar. 25, 1980

[51] Int. Cl.³ ............................................... H03F 3/38
[52] U.S. Cl. ....................................................... 330/10
[58] Field of Search ............... 330/10, 51, 207 A, 251; 328/14

[56] References Cited

U.S. PATENT DOCUMENTS

| | | | |
|---|---|---|---|
| 4,153,882 | 5/1979 | Fisher et al. | 330/10 |
| 4,162,475 | 7/1979 | Fisher et al. | 340/8 R |
| 4,178,553 | 12/1979 | Fisher et al. | 325/487 |

OTHER PUBLICATIONS

Panter, *Modulation, Noise, and Spectral Analysis* McGraw-Hill Book Company 1965 pp. 507–547.
*Transmission System for Communication*, Bell Telephone Laboratories, New York, 1971, pp. 116–122, 142, 566–576.
Sams, *Reference Data for Radio Engineers*, 1969, pp. 6–10, 6–11, 21–13, 21–14, 29–12.
Flagle, "Variable-Pulse-Width Generator", *E.E.E.* 11:8, pp. 27, 28.

Primary Examiner—James B. Mullins

[57] ABSTRACT

An amplifier for a band-limited signal, which produces an amplified output signal by sampling the input signal at a frequency greater than the Nyquist frequency for the signal frequency band, quantizing the signal samples, activating one or more of a plurality of output leads for each quantized sample, actuating switches by the activated quantizer output leads to charge and discharge one or more capacitors in the interval between adjacent samples through windings of an output transformer, and filtering the output of the transformer to produce an amplified quantized replica of the input signal. High power and high efficiency are obtained with moderate voltages and capacitor values, and with available switching devices, for signals with a Nyquist frequency up to several hundred kilohertz.

3 Claims, 1 Drawing Figure

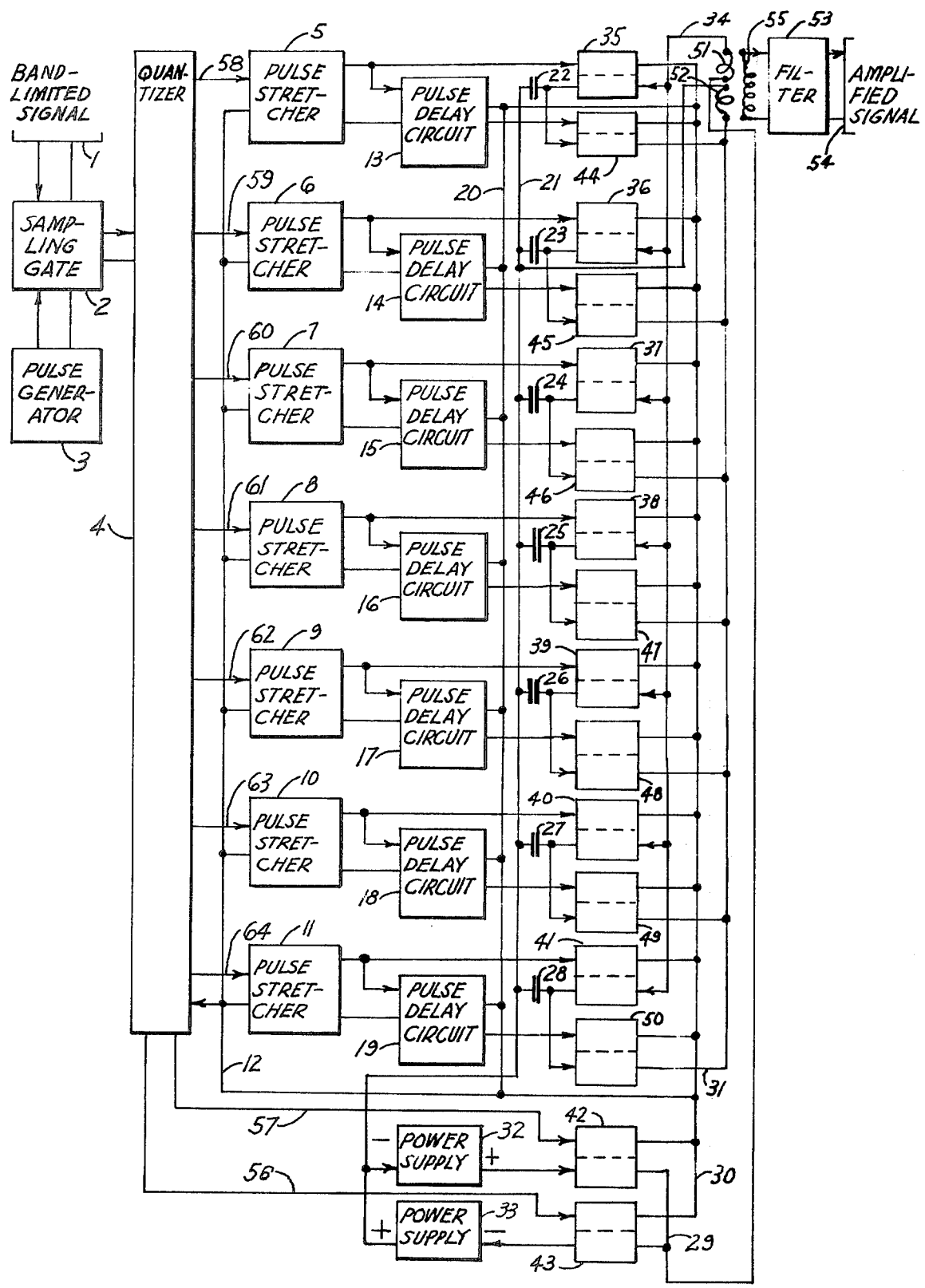

AMPLIFIER WITH SWITCHED CAPACITORS

BACKGROUND OF THE INVENTION

This patent relates to switching amplifiers for band-limited signals using the repeated charge and discharge of a variable group of capacitors to deliver an amplified output signal.

Switching type amplifiers are disclosed in U.S. Pat. No. 4,153,882, class 330/10, granted May 8, 1979 to Fisher et al, and in U.S. Pat. No. 2,379,513, class 330/10X, granted July 3, 1945 to Fisher. Neither of these patents discloses an amplifier in which the amplified output signal is produced by charging and discharging a variable group of capacitors. U.S. Pat. No. 4,162,475, class 340/8R, granted July 24, 1979 to Fisher et al, shows a transducer in which the output power is obtained by using sums of numbers in a binary series.

We do not known of any prior patent art, publication or apparatus which are relevant to this invention.

BRIEF DESCRIPTION OF THE INVENTION

An amplifier for a band-limited input signal, which does not include zero frequency, produces an amplified output signal by taking short samples of the input signal at a frequency greater than the minimum sampling or Nyquist frequency, quantizing the samples by comparison against a set of predetermined discrete amplitudes, and activating a group of a plurality of output switching leads for each sample through a pulse stretcher for a period of time less than one-half the sampling interval. Each activated lead actuates one or more of a plurality of charging switches for each sample. Each actuated charging switch causes a d-c power supply to charge a capacitor through a first primary winding of an output transformer. A pulse from a pulse stretcher is also delayed in a pulse delay circuit for a period of time less than one-half the sampling interval, and actuates one or more of a plurality of discharging switches for each sample. Each actuated discharging switch discharges a capacitor which has just been charged by a charging switch, through a second primary winding of the output transformer, with the same number of turns as the first winding. The charge and the discharge of the capacitor or capacitors, occurring during the same sampling interval, are additive at the secondary winding of the transformer, and pass through a filter which delivers an amplified replica of the signal to the output circuit.

The quantizer has output leads controlled by the polarity of each quantized pulse, which actuate switches which connect the power supply and transformer windings so that the pulses delivered to the filter for each sample are of the correct polarity.

BRIEF DESCRIPTION OF THE DRAWING

The drawing shows a simplified block schematic diagram of an amplifier according to the invention.

DETAILED DESCRIPTION OF THE INVENTION

This invention utilizes the well-known sampling principle of information theory, which includes the following theorems:

(1) A band-limited signal is fully defined by a sequence of short samples taken at regular intervals with a frequency greater than the minimum sampling or Nyquist frequency, which is a discontinuous function of the signal frequency band and of its highest frequency. The Nyquist frequency is from two to four times the bandwidth of the frequency band of a generalized signal, and is from one to two times the bandwidth of a double-sideband amplitude-modulated signal.

(2) A sequence of short samples which fully defines a band-limited signal is reconstructed as an analog replica of the signal when the sequence is passed through a filter with a pass-band the same as the signal frequency band, unaltered except for delay and frequency distortion caused by the filter.

The drawing shows a simplified block schematic diagram of an amplifier according to the invention. A band-limited signal 1 is passed through sampling gate 2, opened by regularly-occurring gating pulses from pulse generator 3, which have a repetition frequency greater than the minimum sampling or Nyquist frequency for the signal frequency band, and have a duration which is short compared to the interval of time between sequential pulses. The sampling gate and pulse generator are well-known devices in the prior art.

The output of sampling gate 2 is delivered to quantizer 4, which compares the amplitude of each input sample with a predetermined set of discrete amplitudes. Quantizers are widely used in pulse code modulation telephony. The quantizer quantifies each pulse as being nearest in amplitude to one of the predetermined amplitudes, and in response to each input pulse activates a unique combination of one or more output leads. Lead 56 is activated if the sample has a first polarity, and lead 57 if the sample has a second polarity.

A unique combination of one or more of output leads 58 to 64 inclusive is activated for each quantized pulse, depending on the quantized pulse amplitude. For example if the quantizer has, as a set of discrete predetermined values, zero and every positive and negative integer from 1 to 127 inclusive, then each of the seven output leads 58 to 64 inclusive represents one of the binary series amplitudes of 1, 2, 4, 8, 16, 32 and 64. The return path to quantizer 4 for all output circuits is completed over leads 12, 20 and 30.

Leads 58 to 64 inclusive each connect to one of pulse stretchers 5 to 11 inclusive. A pulse stretcher is a well-known device which here extends the duration of the short pulses delivered to it to a duration of nearly half the interval between pulses. Thus if the sampling frequency is 8000 samples per second, resulting in a sampling interval of 125 $\mu$S, with a sample duration of 10 $\mu$S, the pulse stretcher extends the pulse duration to about 60 $\mu$S.

Each of pulse stretchers 5 to 11 inclusive connects to one terminal of the control circuit of one of charging switches 35 to 41 inclusive. These are solid-state switches with two control terminals insulated from two switching terminals. The switching terminals are normally open, are connected when the control circuit is energized, have negligible resistance and are switched at high speed. Switches of these characteristics are readily available in the prior art. Switches 35 to 41 inclusive may each switch different currents, as in the example given in the paragraph next above, varying by a ratio of 64 to 1.

Each charging switch 35 to 41 inclusive when actuated connects one of capacitors 22 to 28 inclusive through output transformer first primary winding 51 by way of leads 34, 29 and 21 and one of switches 42 and 43, across one of d-c power supplies 32 and 33, of substantially identical characteristics but opposite polarity.

When switch 42 is actuated by quantizer output lead 57, capacitor charging current flows upwards in winding 51, and when switch 43 is actuated by quantizer output lead 56, capacitor charging current flows downwards in winding 51. The resistance coupled from output transformer secondary winding 55, filter 53 and the load on output circuit 54 is designed so that the largest capacitor of capacitors 22 to 28 inclusive is charged substantially to the power supply voltage during the period the associated charging switch is actuated.

Each of pulse stretchers 5 to 11 inclusive delivers an output pulse to one of pulse delay circuits 13 to 19 inclusive, which delays the output pulse of the associated pulse stretcher by substantially one-half the sampling period. In the numerical example given above, with a sampling interval of 125 $\mu$S, this may be approximately 62.5 $\mu$S. Pulse delay circuits are well-known in the prior art.

The output of each pulse delay circuit 13 to 19 inclusive is connected to one terminal of the control circuit of one of discharging switches 44 to 50 inclusive. These switches have the same description as charging switches 35 to 41 inclusive described above.

Each discharging switch 44 to 50 inclusive, when actuated, connects one of capacitors 22 to 28 inclusive across output transformer second primary winding 52 through leads 21 and 31. Winding 52 is poled and designed so that the pulse of current due to the discharging of a capacitor induces a voltage in winding 55 of the same amplitude and polarity as the voltage induced in winding 55 by the immediately preceding charging of the same capacitor through winding 51.

Winding 55 delivers power through filter 53 to the output load 54. Filter 53 may be a band-pass filter using the self-inductance of winding 55 and the leakage inductance between primary windings 51 and 52 and secondary winding 55 as part of the filter structure. Filter 53 has a pass-band substantially identical with the signal frequency band, and delivers a quantized amplified replica of the input signal, altered only by quantizing noise, and delay and frequency distortion due to the output transformer and filter 53.

A number of variations of the drawings are within the scope of the invention. The input signal may be continuously of a single polarity, so that leads 56 and 57, switches 42 and 43 and one power supply may be omitted. Corresponding circuit changes are obvious. The number of quantizer switching leads, pulse stretchers, pulse delay circuits, capacitors, charging switches and discharging switches, shown as seven in the drawing, may be a different value. The capacitances of the switched capacitors need not follow a binary series as used in the example, but may be of any value appropriate to the wave being amplified. The circuit details involving power supplies 32 and 33, switches 42 and 43, and windings 51 and 52 may be re-arranged in several obvious ways to cause the amplified signal to change polarity when the input signal changes polarity. For example a single power supply may be used with four polarity-reversing switches controlled from quantizer 4. If desired the sampling frequency may be substantially increased beyond the Nyquist frequency, and for a given maximum power output the values of power supply voltage and switched capacitors is then altered.

A numerical example of an amplifier according to the invention is further explanatory. We assume a speech signal amplifier with a frequency range of 200 to 3400 Hz, with a sampling frequency of 8000 samples per second, which results in a sampling interval of 125 $\mu$S. When amplifying a single sine wave the amplifier has a maximum r.m.s. output power of 50 kW, corresponding to a maximum peak output power of 100 kW. The power supplies each have a voltage of 4000. The total switched capacitance is C$\mu$F, so that the largest switched capacitor has a capacitance of approximately C/2 $\mu$F. The impedance presented by each primary winding of the output transformer is assumed to be a constant resistance of R ohms across the spectrum. This is a reasonable and conservative simplification. The output transformer and filter are assumed to have negligible loss in the signal frequency band. The time constant T of the largest switched capacitor and resistance of R ohms is assumed to be 12.5 $\mu$S, so that the capacitor has a period of approximately 62.5 $\mu$S, equal to five times the time constant, to be charged through the resistance R, and has the same time to be discharged. This results in a charge of about 99.3% of the theoretical maximum value for the largest switched capacitor.

The well-known equations for capacitor charge and discharge are given in "Reference Data for Radio Engineers," Howard W. Sams 1969, pages 6-10 and 6-11. Where E is the voltage, C the capacity in farads, T the time constant in which the capacitor is charged to $\frac{1}{2}$.718 of the maximum charge through a resistance R ohms, then $T=RC$, the energy stored in a capacitor is $\frac{1}{2}$ CE$^2$ watt-seconds, and the capacitor is charged or discharged to (1-$\frac{1}{2}$.718$^5$) or 99.3% of its maximum charge in a period equal to five time constants.

At the peak of the maximum sine-wave signal the total switched capacity C is alternately charged to a voltage of 4000 and immediately discharged through equal windings of the output transformer, each charge or discharge occurring 8000 times per second. Then the total power passing through the transformer windings is 2$\times$8000$\times\frac{1}{2}$C (4000)$^2$ watts. Setting this equal to 100,000 watts and solving for C gives a value of 0.78 $\mu$F. Then the time constant of the largest switched capacitor, 12.5 $\mu$S, is equal to 0.39 R, and R is equal to 32 ohms. These values of switching frequency, time constant, voltage, capacity and resistance are all within readily usable ranges, and show the usefulness of the invention.

We claim:

1. An amplifier for a band-limited signal, which comprises sampling means which produces samples of said signal at regular intervals with a sampling frequency greater than the minimum sampling or Nyquist frequency for said signal frequency band, and quantizing means which quantizes each of said samples of said signal to one of a plurality of predetermined discrete amplitudes, and a plurality of switching means, one or more of which are actuated by said quantizing means as each of said samples is received, which charge to a substantially fixed potential of selected polarity and subsequently discharge a unique group of one or more capacitors, with a total capacitance which is a function of the amplitude of said quantized sample, said group forming part of a plurality of capacitors, during a period not greater than the spacing of two adjacent samples of said samples, through output means which adds arithmetically the currents due to said charge and said discharge, and passes the total of said currents through filter means which has a pass-band substantially the same as said signal frequency band, to an external load.

2. An amplifier for a band-limited signal according to claim 1 which comprises:

said sampling means which receives said signal and is opened by regularly-occurring gating pulses from a pulse generator, said pulses having a short duration compared to the spacing of said pulses and occurring at a frequency greater than the minimum sampling or Nyquist frequency for said signal frequency band, and which produces a sequence of signal samples, and said quantizing means which receives said signal samples and compares the amplitude of each of said signal samples with said plurality of predetermined discrete amplitudes, and activates a unique combination of one or more of a plurality of output leads for each of said signal samples, said unique combination being a function of the amplitude and polarity of the amplitude of said predetermined discrete amplitude which has the same polarity and is closest in amplitude to said amplitude of said signal sample, and a plurality of pulse stretcher means, each of which is connected to a different lead of said plurality of said output leads of said quantizing means, except those leads of said plurality of output leads which indicate polarity of said signal samples, and which extends a pulse which activates said lead to a duration at the output lead of said pulse stretcher means approximately equal to but less than one-half the spacing of said gating pulses, and a plurality of capacitor charging switching means, each of which is actuated by a different one of said plurality of said pulse stretcher means when said pulse stretcher means is connected to an activated lead of said plurality of output leads, and a plurality of said capacitors, each of which is connected by a different capacitor charging switching means of said plurality of capacitor charging switching means, when actuated, to a source of d-c voltage of a polarity selected by said quantizing means, through a first primary winding of an output transformer, causing capacitor charging current to flow in said first primary winding, and a plurality of pulse delay means, each of which receives the output of a different one of said plurality of pulse stretching means, and delays a pulse delivered by said pulse stretching means by a period of time approximately equal to one-half the spacing of said pulses, and a plurality of capacitor discharging switching means, each capacitor discharging switching means of which is actuated by a pulse from a different one of said plurality of said pulse delay means when said pulse delay means is connected to an activated one of said plurality of said pulse stretcher means, and which, when actuated, causes a different one of said capacitors to discharge through a second primary winding of said output transformer, causing capacitor discharging current to flow in said second primary winding, which is substantially identical to said first primary winding, in a direction which causes the currents induced in a secondary winding of said output transformer due to said capacitor charging current and said capacitor discharging current to be substantially equal and of the same polarity, and said filter means which receives the output from said secondary winding of said output transformer, and delivers an amplitude replica of said signal substantially unaltered in waveform except for quantizing noise due to said quantizing means and for delay and frequency distortion due to said output transformer and said filter means.

3. An amplifier for a band-limited signal according to claim 1 in which the values of capacitance of the capacitors of said plurality of capacitors form a binary geometric series.

* * * * *